US012651691B2

(12) United States Patent
Taylor

(10) Patent No.: US 12,651,691 B2
(45) Date of Patent: Jun. 9, 2026

(54) VOLTAGE-ISOLATED INTEGRATED CIRCUIT PACKAGES WITH PLANAR TRANSFORMERS

(71) Applicant: Allegro MicroSystems, LLC, Manchester, NH (US)

(72) Inventor: William P. Taylor, Amherst, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 353 days.

(21) Appl. No.: 18/350,049

(22) Filed: Jul. 11, 2023

(65) Prior Publication Data

US 2025/0022646 A1     Jan. 16, 2025

(51) Int. Cl.
| | |
|---|---|
| *H01F 27/28* | (2006.01) |
| *H01F 27/24* | (2006.01) |
| *H01F 41/24* | (2006.01) |
| *H01F 41/26* | (2006.01) |
| *H10D 1/20* | (2025.01) |

(52) U.S. Cl.
CPC ......... *H01F 27/2804* (2013.01); *H01F 27/24* (2013.01); *H01F 41/24* (2013.01); *H01F 41/26* (2013.01); *H10D 1/20* (2025.01); *H01F 2027/2819* (2013.01)

(58) Field of Classification Search
None
See application file for complete search history.

(56) References Cited

U.S. PATENT DOCUMENTS

| | | | |
|---|---|---|---|
| 3,858,138 | A | 12/1974 | Gittleman et al. |
| 4,461,966 | A | 7/1984 | Hebenstreit |
| | | (Continued) | |

FOREIGN PATENT DOCUMENTS

| | | | |
|---|---|---|---|
| DE | | 3700488 A1 | 7/1988 |
| DE | 10 2004 033 125 A1 | | 2/2006 |
| | | (Continued) | |

OTHER PUBLICATIONS

U.S. Appl. No. 18/302,998, filed Apr. 19, 2023, Salato et al.
(Continued)

*Primary Examiner* — Jeff W Natalini
*Assistant Examiner* — Jacob Raul Marin
(74) *Attorney, Agent, or Firm* — DALY, CROWLEY, MOFFORD & DURKEE, LLP

(57)     ABSTRACT

Aspects of the present disclosure include systems, structures, circuits, and methods providing planar transformers and planar transformer structures. The planar transformers and transformer structures can include first and second core layers of soft ferromagnetic material on opposite sides of an electrical substrate. First and second coils can be configured as conductive traces disposed on the opposite sides of the substrate. The first and second soft ferromagnetic layers are in contact in a contact region. One or more holes are disposed in either or both of the soft ferromagnetic layers and contain soft ferromagnetic material to reduce reluctance of the transformer structure. The planar transformer can be included in integrated circuit (chip) packages or modules. The packages and modules may include various types of circuits; in some examples, chip packages or modules may include a gate driver or other high voltage circuit.

21 Claims, 7 Drawing Sheets

(56) References Cited

U.S. PATENT DOCUMENTS

| | | | |
|---|---|---|---|
| 4,748,351 A | 5/1988 | Barzegar | |
| 4,970,420 A | 11/1990 | Billings | |
| 5,019,719 A | 5/1991 | King | |
| 5,051,609 A | 9/1991 | Smith | |
| 5,430,613 A | 7/1995 | Hastings et al. | |
| 5,598,135 A | 1/1997 | Maeda et al. | |
| 5,847,631 A | 12/1998 | Taylor et al. | |
| 5,926,003 A | 7/1999 | Morita | |
| 5,959,846 A | 9/1999 | Noguchi et al. | |
| 6,107,860 A | 8/2000 | Vinciarelli | |
| 6,181,130 B1 | 1/2001 | Hoshi et al. | |
| 6,281,560 B1 | 8/2001 | Allen et al. | |
| 6,377,155 B1 | 4/2002 | Allen et al. | |
| 6,605,939 B1 * | 8/2003 | Jansseune | G01D 5/2033 |
| | | | 324/207.16 |
| 6,775,901 B1 | 8/2004 | Lee et al. | |
| 6,791,851 B2 | 9/2004 | Brkovic | |
| 7,023,315 B2 | 4/2006 | Yeo et al. | |
| 7,119,448 B1 | 10/2006 | de Stasi | |
| 7,173,835 B1 | 2/2007 | Yang | |
| 7,663,351 B2 | 2/2010 | Korsunsky | |
| 7,719,112 B2 | 5/2010 | Shen | |
| 7,804,697 B2 | 9/2010 | Melanson | |
| 7,868,431 B2 | 1/2011 | Feng et al. | |
| 8,063,689 B2 | 11/2011 | Theiler | |
| 8,094,458 B2 | 1/2012 | Furnival | |
| 8,217,748 B2 | 7/2012 | Feng et al. | |
| 8,446,243 B2 | 5/2013 | Strzalkowski et al. | |
| 8,680,837 B2 | 3/2014 | Zeng et al. | |
| 8,736,343 B2 | 5/2014 | Chen et al. | |
| 8,816,666 B2 | 8/2014 | Kimura et al. | |
| 9,048,020 B2 | 6/2015 | Calvillo Cortes et al. | |
| 9,341,657 B2 * | 5/2016 | Klein | G01R 33/04 |
| 9,640,409 B1 * | 5/2017 | Yang | H01L 21/0337 |
| 9,660,584 B2 | 5/2017 | Modi et al. | |
| 9,743,523 B2 | 8/2017 | Huang et al. | |
| 9,847,166 B2 | 12/2017 | Kneller | |
| 9,887,034 B2 | 2/2018 | Francis | |
| 9,899,140 B2 | 2/2018 | Kneller et al. | |
| 9,922,764 B2 | 3/2018 | Kneller et al. | |
| 9,948,294 B2 | 4/2018 | Peter et al. | |
| 10,002,703 B2 | 6/2018 | Wang et al. | |
| 10,014,798 B1 | 7/2018 | Vinciarelli | |
| 10,062,495 B2 | 8/2018 | Lloyd | |
| 10,176,917 B2 | 1/2019 | Parish et al. | |
| 10,217,558 B2 | 2/2019 | Kneller | |
| 10,224,143 B2 | 3/2019 | Kneller et al. | |
| 10,229,779 B2 | 3/2019 | Harber | |
| 10,234,513 B2 | 3/2019 | Vig et al. | |
| 10,256,027 B2 | 4/2019 | Li et al. | |
| 10,319,509 B2 | 6/2019 | Kneller et al. | |
| 10,347,413 B2 | 7/2019 | Francis | |
| 10,573,457 B2 | 2/2020 | Wang et al. | |
| 10,811,181 B2 | 10/2020 | Parish et al. | |
| 10,842,021 B1 * | 11/2020 | Song | H01F 27/24 |
| 10,930,422 B2 | 2/2021 | Francis | |
| 11,139,102 B2 | 10/2021 | Kneller et al. | |
| 11,201,619 B2 | 12/2021 | Rinne et al. | |
| 11,211,929 B2 | 12/2021 | Rinne et al. | |
| 11,282,631 B2 | 3/2022 | Francis | |
| 2006/0022683 A1 | 2/2006 | Johnson et al. | |
| 2008/0100395 A1 | 5/2008 | Oikawa et al. | |
| 2009/0134964 A1 | 5/2009 | Hebert et al. | |
| 2009/0147544 A1 | 6/2009 | Melanson | |
| 2009/0237899 A1 | 9/2009 | Furnival | |
| 2012/0008344 A1 | 1/2012 | Zeng et al. | |
| 2012/0206171 A1 | 8/2012 | Kimura et al. | |
| 2013/0293268 A1 | 11/2013 | Draxelmayr et al. | |
| 2016/0181004 A1 | 6/2016 | Li et al. | |
| 2017/0232436 A1 * | 8/2017 | Bachman | C12M 47/04 |
| | | | 435/34 |
| 2017/0352473 A1 | 12/2017 | Wang | |
| 2018/0072004 A1 * | 3/2018 | Roth | B32B 5/245 |
| 2018/0254258 A1 | 9/2018 | Ghannam | |
| 2018/0323133 A1 | 11/2018 | Kirby | |
| 2020/0211961 A1 | 7/2020 | Khanolkar | |
| 2021/0043361 A1 | 2/2021 | Osada | |
| 2021/0166860 A1 | 6/2021 | Silva | |
| 2021/0256920 A1 * | 8/2021 | Bishop | G09G 3/348 |
| 2021/0376822 A1 | 12/2021 | Thompson et al. | |
| 2022/0116036 A1 | 4/2022 | Rinne et al. | |
| 2022/0159839 A1 * | 5/2022 | Cho | H05K 1/0298 |
| 2022/0301762 A1 | 9/2022 | Tsuchida et al. | |
| 2023/0094556 A1 | 3/2023 | Tuncer | |
| 2023/0216481 A1 * | 7/2023 | Sung | H03H 9/132 |
| | | | 310/365 |

FOREIGN PATENT DOCUMENTS

| | | | |
|---|---|---|---|
| EP | 1 091 404 A1 | 4/2001 | |
| GB | 2 250 383 A | 6/1992 | |
| GB | 2 341 288 A | 3/2000 | |
| JP | H01300617 A | 12/1989 | |
| JP | 2001 167941 A | 6/2001 | |
| JP | 2003 234234 A | 8/2003 | |
| JP | 2008 072021 A | 3/2008 | |
| WO | WO 93/21690 33 | 10/1993 | |
| WO | WO 95/12247 14 | 5/1995 | |
| WO | WO 00/42636 24 | 7/2000 | |
| WO | WO 2009/008739 A1 | 1/2009 | |
| WO | WO 2010/061281 A2 | 6/2010 | |
| WO | WO 2011/137845 A1 | 11/2011 | |
| WO | WO 2021/211920 A1 | 10/2021 | |

OTHER PUBLICATIONS

U.S. Appl. No. 18/338,479, filed Jun. 21, 2023, Taylor.

Bourgeois, "An Isolated Gate 25 Drive For Power MOSFETs and IGBTs", STMicroelectronics Group, AN461/0194, 1999; 7 pages.

"ADuM4135 Data Sheet, Single-/Dual-Supply, High Voltage Isolated IGBT Gate Driver with Miller Clamp", Analog Devices Inc., Rev. E, 2015; 17 pages.

"Si827x", Datasheet Rev. 0.5, Silicon Laboratories Inc., 2016; 43 pages.

International Search Report and Written Opinion dated Jun. 26, 2024, for International Application No. PCT/US2024/016822; 14 pages.

Sefa et al., "A comparative study of nanocrystalline and SiFe core materials for medium-frequency transformers"; IEEE International Conference on Electronics, Computers and Artificial Intelligence (ECAI); Oct. 2014; 6 pages.

International Search Report and Written Opinion dated Jul. 30, 2024, for International Application No. PCT/US2024/024705; 20 pages.

U.S. Non-Final Office Action dated Sep. 26, 2025 for U.S. Appl. No. 18/338,479; 19 Pages.

Response to U.S. Non-Final Office Action dated Sep. 26, 2025 for U.S. Appl. No. 18/338,479; Response Filed Feb. 2, 2026; 19 Pages.

U.S. Non-Final Office Action dated Mar. 11, 2026 for U.S. Appl. No. 18/338,479; 20 Pages.

* cited by examiner

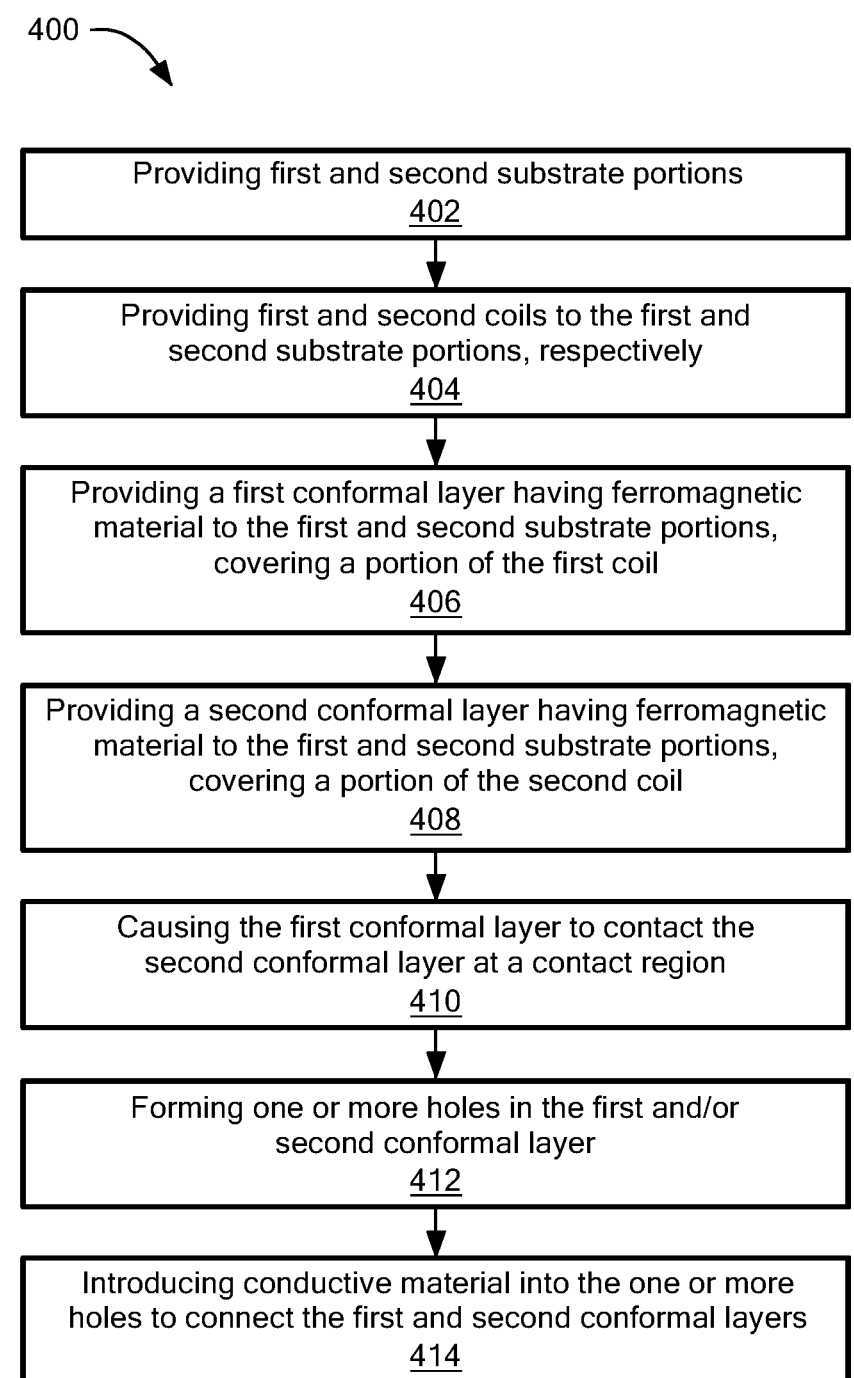

400

Providing first and second substrate portions
402

Providing first and second coils to the first and
second substrate portions, respectively
404

Providing a first conformal layer having ferromagnetic
material to the first and second substrate portions,
covering a portion of the first coil
406

Providing a second conformal layer having ferromagnetic
material to the first and second substrate portions,
covering a portion of the second coil
408

Causing the first conformal layer to contact the
second conformal layer at a contact region
410

Forming one or more holes in the first and/or
second conformal layer
412

Introducing conductive material into the one or more
holes to connect the first and second conformal layers
414

*FIG. 4*

VOLTAGE-ISOLATED INTEGRATED CIRCUIT PACKAGES WITH PLANAR TRANSFORMERS

BACKGROUND

Solid-state switches typically include a transistor structure and are usually either turned on or turned off. The controlling electrode of the switch, usually referred to as its gate (or base), is typically controlled (driven) by a switch drive circuit, sometimes also referred to as gate drive circuit. Such solid-state switches are typically voltage-controlled, turning on when the gate voltage exceeds a manufacturer-specific threshold voltage by a margin, and turning off when the gate voltage remains below the threshold voltage by a margin.

Switch drive circuits typically receive their control instructions from a controller such as a pulse-width-modulated (PWM) controller via one or more switch driver inputs. Switch drive circuits deliver their drive signals directly (or indirectly via networks of active and passive components) to the respective terminals of the switch (gate and source).

Some electronic systems, including ones with solid-state switches, have employed galvanic isolation to prevent undesirable DC currents flowing from one side of an isolation barrier to the other. Such galvanic isolation can be used to separate circuits in order to protect users from coming into direct contact with hazardous voltages.

Various transmission techniques are available for signals to be sent across galvanic isolation barriers including optical, capacitive, and magnetic coupling techniques. Magnetic coupling typically relies on use of a transformer to magnetically couple circuits on the different sides of the transformer, typically referred to as the primary and secondary sides, while also providing galvanic separation of the circuits.

Transformers used for magnetic coupling isolation barriers typically utilize a magnetic core to provide a magnetic path to channel flux created by the currents flowing in the primary and secondary sides of the transformer. Magnetic-coupling isolation barriers have been shown to have various drawbacks, including manufacturing problems, for integrated circuit (IC) packages due to the included magnetic core. For example, misalignment and/or surface irregularities of transformer core pieces typically present local breaks in contiguity of the core, increasing reluctance, and causing loss in efficiency of the transformer.

SUMMARY

A general aspect of the present disclosure includes planar transformer structures that may be used for chip packages, e.g., for chip packages including galvanically isolated integrated circuits (ICs). A planar transformer can include a first substrate portion (e.g., a first side or surface) having a first plurality of conductive traces forming a first coil and a second substrate portion (e.g., a second side or surface) having a second plurality of conductive traces forming a second coil. The second substrate portion may be substantially coplanar with and spaced apart from the first substrate portion. A first core layer may be disposed over the first substrate portion (first surface). The first core layer may include a soft ferromagnetic material. A second core layer may be disposed over the second substrate portion (second surface). The second core layer may include a soft ferromagnetic material. A first contact portion of the first core layer may be in contact with a second contact portion of the second core layer at a contact region, e.g., in an aperture or hole formed/present in the substrate. A first insulating layer may be disposed between the first surface (first substrate portion) and the first core layer. A second insulating layer may be disposed between the second surface (second substrate portion) and the second core layer. One or more through holes may be disposed in the first or second core layer, e.g., at first contact portion or the second contact portion of the contact region. The one or more through holes may include a soft ferromagnetic material to connect the first core layer to the second core layer.

Implementations may include one or more of the following features. The transformer may include a post disposed between the first and second core layers and between the first and second substrate portions, where the post may include a soft ferromagnetic material. The first substrate portion or the second substrate portion may include or be part of a printed circuit board (PCB). The first substrate portion or the second substrate portion may include or be part of a ceramic substrate. The first substrate portion or the second substrate portion may include or be part of a flexible substrate. The flexible substrate may include a flexible circuit. The first or second substrate portion (surface) may include or support (directly or indirectly) one or more semiconductor die. The semiconductor die may include an integrated circuit (IC). The integrated circuit may include a gate driver. The transformer may include a molding material configured to cover the first or second core layers and forming a package body. The first core layer or the second core layer may include a conformal layer. In some embodiments, the first and second coils can be or form primary and secondary coils of the transformer. In some embodiments, a transformer may have, e.g., a step-up, a step-down, or a power transformer configuration. In some embodiments, the secondary coil may be on a high-voltage side of the transformer, with the transformer in a step-up configuration.

One general aspect of the present disclosure includes a method of making a planar transformer structure. The method can include providing first and second substrate portions (surfaces of a substrate); providing first and second coils to the first and second substrate portions, respectively; providing a first core layer having soft ferromagnetic material to the first substrate portion (first surface), covering a portion of the first coil; providing a second core layer having soft ferromagnetic material to the second substrate portion (second surface), covering a portion of the second coil; causing the first core layer to contact the second core layer at a contact region; forming one or more holes in the first core layer or the second core layer at the contact region; and introducing soft ferromagnetic material into the one or more through holes, where the soft ferromagnetic material connects the first core layer to the second core layer.

Implementations may include one or more of the following features. The method may include positioning a post (column) between the first core layer and the second core layer, e.g., in or through an aperture or hole, where the post may include a soft ferromagnetic material. The first substrate portion or the second substrate portion may include or be part of a printed circuit board (PCB). The first substrate portion or the second substrate portion may include or be part of a ceramic substrate. The first substrate portion or the second substrate portion may include or be part of a flexible substrate. The flexible substrate may include or be part of a flexible circuit. The first substrate portion or the second substrate portion may include one or more semiconductor die. The semiconductor die may include an integrated circuit (IC). The integrated circuit may include a gate driver. The method may include applying a molding material to cover the first and second core layers and forming a package body. The first core layer or the second core layer may include a conformal layer.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 4 is a box diagram showing an example method of fabricating a planar transformer for an IC package, in accordance with the present disclosure.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments/implementations. What follows is illustrative, but not exhaustive, of the scope of the subject technology.

Aspects of the present disclosure are directed to and include systems, structures, circuits, and methods providing planar transformers and transformer structures that can be used for galvanic isolation (a.k.a., voltage isolation). Some embodiments and examples can include integrated circuit (IC) packages or modules with a planar voltage-isolation transformer implemented on a substrate, e.g., a PCB or lead frame. The IC packages and modules may include various types of circuits; in some examples, IC packages or modules may include a galvanically isolated gate driver or other high voltage circuit, etc. First and second semiconductor die (a.k.a., "IC die") having one or more integrated circuits can be included in the packages. Such integrated circuits can include, e.g., but are not limited to, high-voltage circuits such as galvanically-isolated gate drivers configured to drive an external gate on a solid-state switch, e.g., a MOSFET, GaNFET, SiCFET, an IGBT, or another load.

Figure 1A:
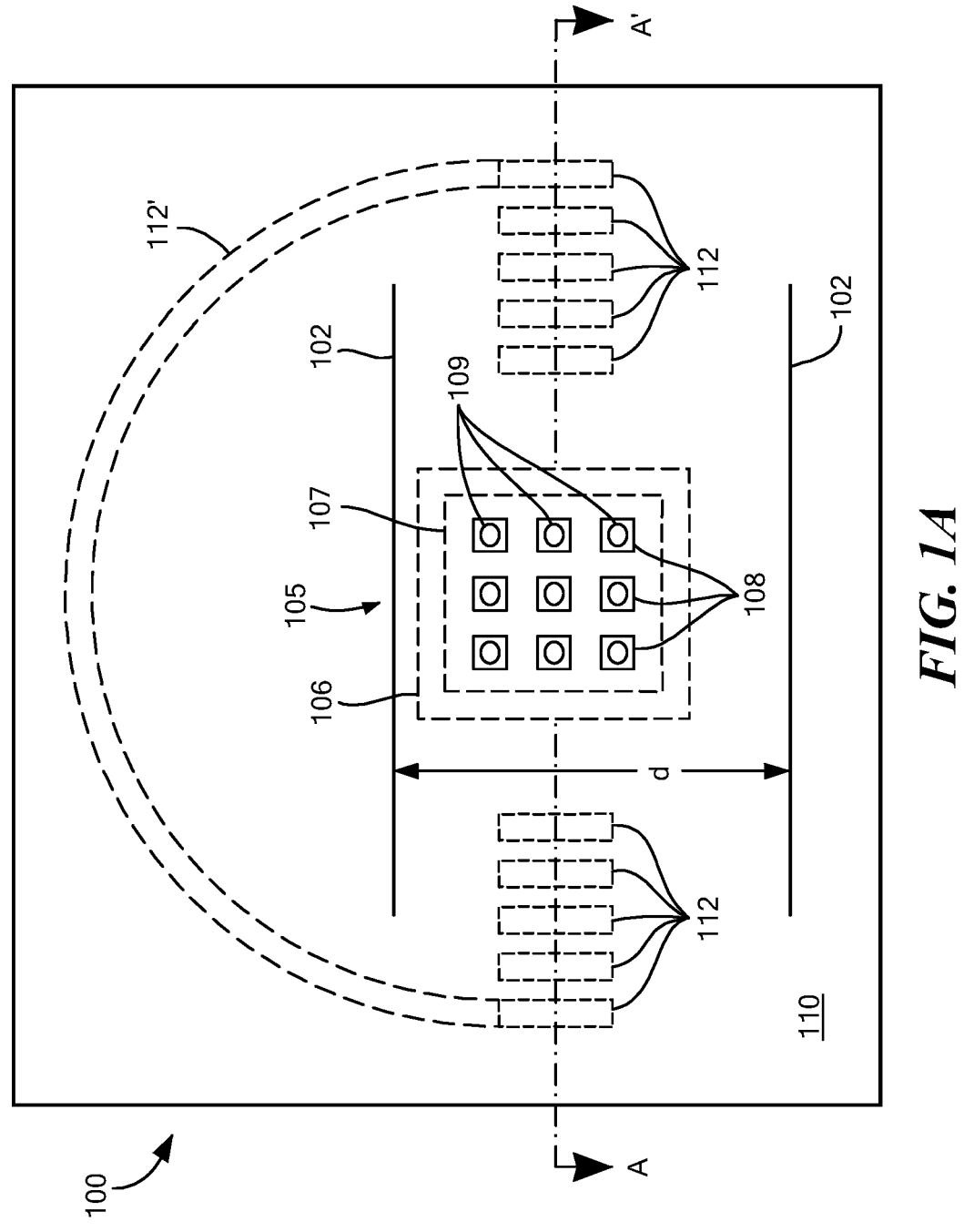
FIG. 1A is a diagram showing a top view of an example planar transformer structure, in accordance with the present disclosure.

FIG. 1A is a diagram showing a top view of an example planar transformer structure 100, in accordance with the present disclosure. Electrical substrate 110 is shown having a first soft ferromagnetic layer 102 disposed on (covering) a portion of a surface of substrate 110. In some examples and embodiments, substrate 110 can include, but is not limited to, a printed circuit board (PCB), flexible substrate or flexible circuit, a lead frame, a glass or ceramic substrate, or the like. A first group of conductive traces 112 are disposed on the substrate and configured as a coil (e.g., a first coil) for transformer structure 100. Traces 112 may have, e.g., a coiled or spiral geometry 112', configured about contact region 106. Of course, traces 112 are not limited to coiled or spiral shapes and other suitable geometries may be used, e.g., elliptical, square, square-like, rectangle, or other polygon shape, etc. Contact region 106 corresponds to an area or region of ferromagnetic layer 102 that is brought into contact with underlying structure—e.g., post/column 107 of soft ferromagnetic material, another layer of soft ferromagnetic material, etc. —used for the core (core structure) 105 of transformer structure 100. Layer 102 is shown as having width, d.

One or more apertures/holes (vias) 108 can be present in layer 102 in the vicinity of the contact region 106. Holes 108 can include or contain soft ferromagnetic 109 material for forming a direct connection between layer 102 and the underlying core structure, e.g., post 107.

Figure 1B:
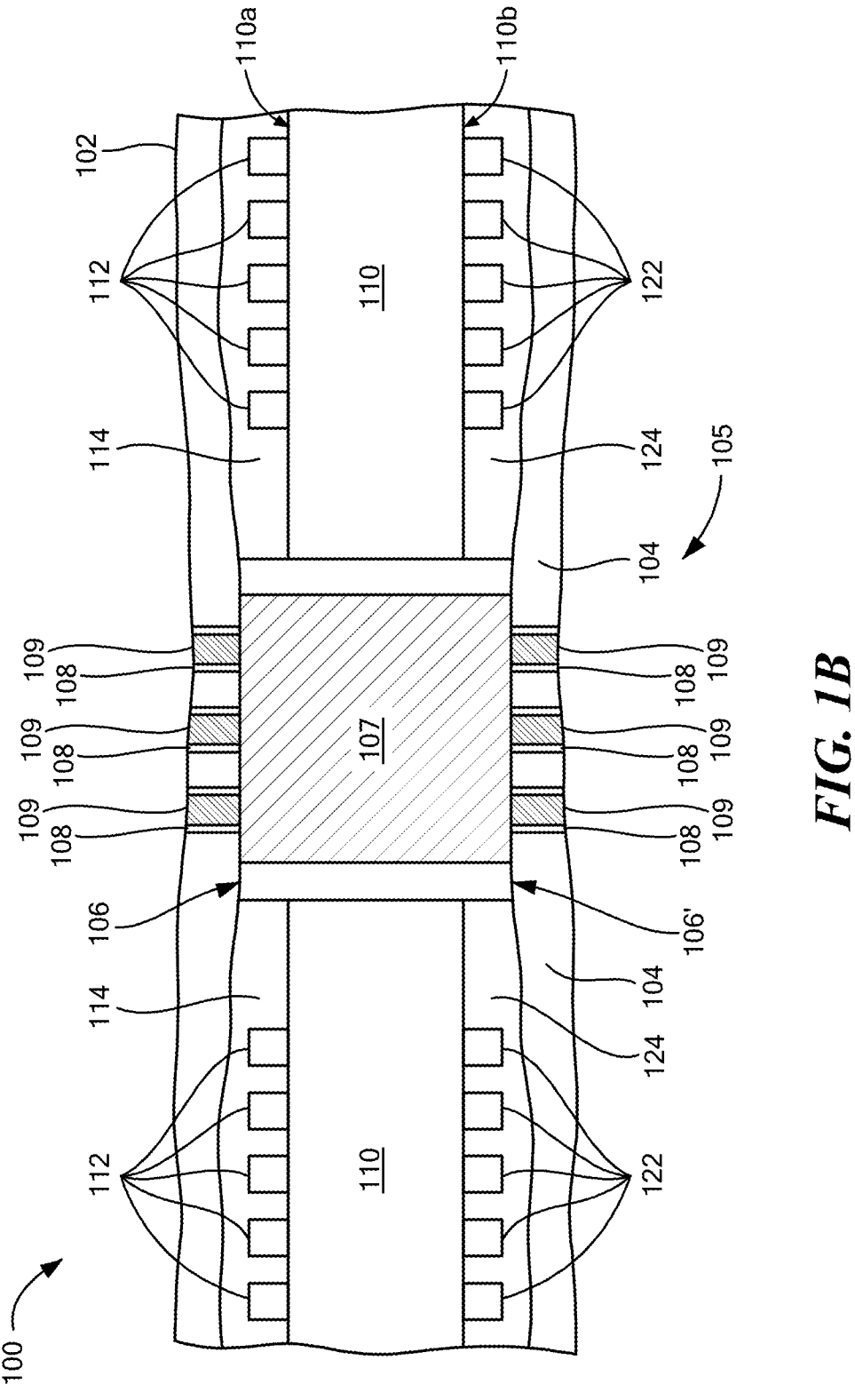
FIG. 1B is a side view of the planar transformer structure of FIG. 1A.

FIG. 1B is a side view of the planar transformer structure 100 of FIG. 1A. Soft ferromagnetic layer 102 is shown as a first layer disposed adjacent (e.g., disposed on or applied to) one side/surface of substrate 110 (shown as first or upper surface 110a) or a material (e.g., insulator material) applied to first surface 110a. Soft ferromagnetic layer 104 is shown as a second layer disposed adjacent (e.g., disposed on or applied to) another side/surface of substrate 110 (shown as second or lower surface 110b) opposite to first ferromagnetic layer or a material (e.g., insulator material) applied to second surface 110b. Any suitable soft ferromagnetic material(s) may be used for layers 102, 104. In some embodiments, a nickel or nickel iron alloy, or other electrically conductive soft ferromagnetic material or alloy may be used for either of or both layers 102, 104. Contact region 106/106' is shown disposed or present in a break or aperture (hole or region) of substrate 110, with region (first contact portion) 106 indicated for layer 102 and region (second contact portion) 106' indicated for layer 104. In addition to conductive traces (coil) 112, a second group of conductive traces 122 is disposed on the lower surface 110b of substrate 110 and configured as a second coil of transformer structure 100. Insulator material 114 may be disposed adjacent conductive traces 112 to prevent shorting across the traces 112. Similarly, insulator material 124 may be disposed adjacent traces 122. Similar to layer 102, one or more apertures/holes 108 may be present in layer 104 in the vicinity of contact region 106'. In some embodiments, the first and second coils can be or form primary and secondary coils of the transformer structure 100. In some embodiments, transformer structure 100 may have, e.g., a step-up, a step-down, or a power transformer configuration. In some embodiments, the secondary coil may be on a high-voltage side of the transformer 100, with the transformer structure (transformer) 100 in a step-up configuration.

The apertures/holes 108 may include soft ferromagnetic material 109 to facilitate a contiguous magnetic path from the first soft ferromagnetic layer 102 and the second soft ferromagnetic layer 104 and for reduction of reluctance of core structure 105. In operation of transformer structure 100, coil 112 and coil 122 can be magnetically coupled, as facilitated by core structure including layers 102, 104, post 107, and soft ferromagnetic material 109.

In some examples and embodiments, soft ferromagnetic material 109 can include, but is not limited to, nickel or nickel iron alloy, which may be deposited by, but not limited to electroplating, or electroless deposition. In some examples and embodiments, soft ferromagnetic material 109 can be introduced into or applied to apertures 108 by electroplating or electroless plating techniques.

Figure 2:
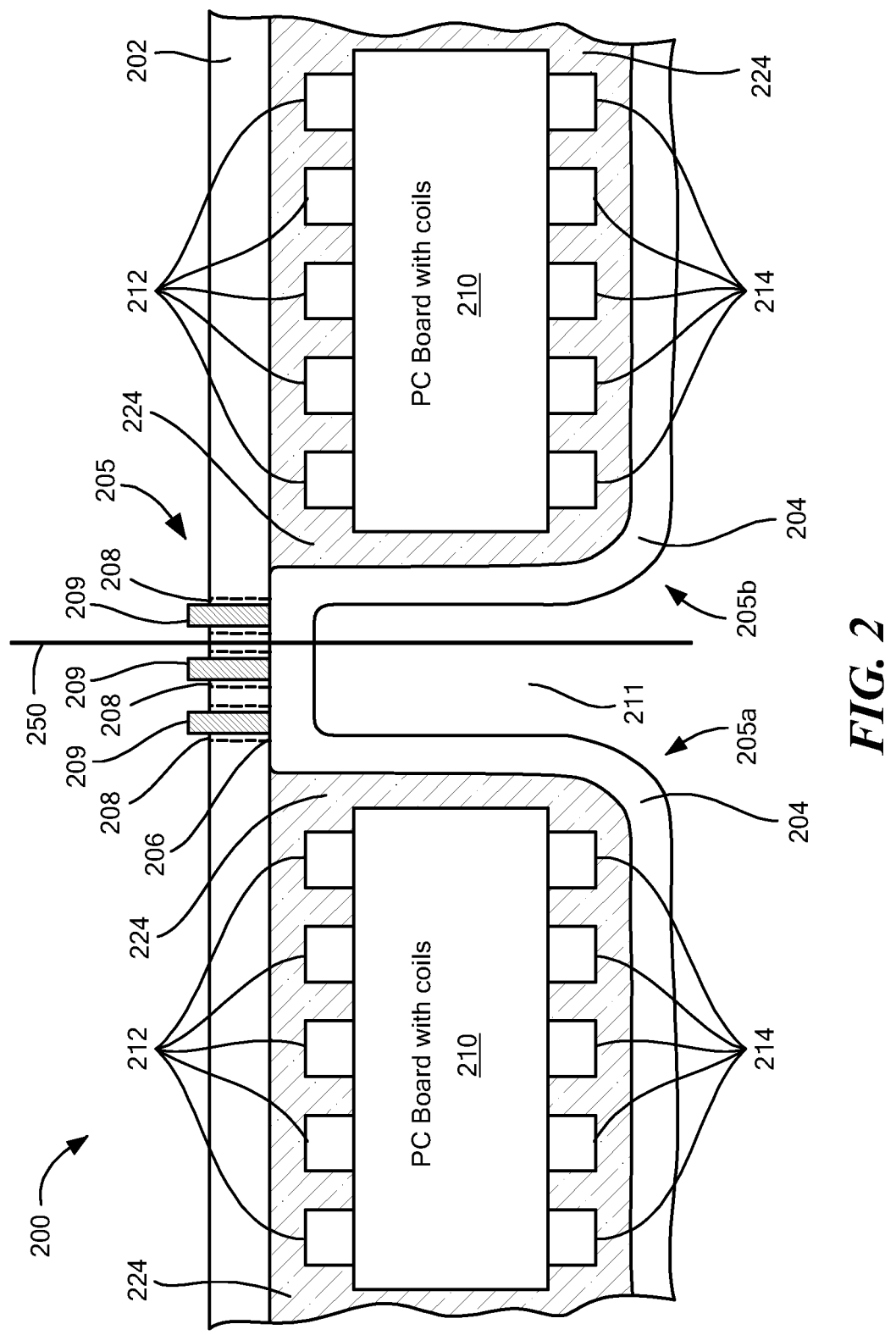
FIG. 2 is a diagram showing a side view of a further example planar transformer structure, in accordance with the present disclosure.

FIG. 2 is a diagram showing a side view of a further example planar transformer structure 200, in accordance with the present disclosure. Structure 200 includes first and second soft ferromagnetic layers 202, 204 as core structure on opposite sides (first and second sides/surfaces) of substrate 210. In some examples, substrate 210 may include a PCB, a flexible substrate (flexible circuit), etc. Layers 202, 204 are in contact at contact region 206. One or both of layers 202 and 204 may include one or more holes/vias 208 for soft ferromagnetic material, e.g., nickel, nickel iron alloy, or other soft ferromagnetic plating material, to reduce reluctance of core structure 205. First and second coils 212, 214 are shown on opposite surfaces of substrate 210. Insulator (dielectric) material may be disposed/deposited adjacent coils 212, 214 to prevent electrical shorting.

Contact region 206 is shown without any post/pillar between layers 202, 204, unlike structure 100 in FIGS. 1A-1B. Space 211 below contact region 206 may be filled with any suitable material; in some examples and embodiments, space 211 may be left empty. In some embodiments, the space 211 may be filled with a soft ferromagnetic material, such as a bulk soft ferromagnetic material, such as a ferrite, or a soft ferromagnetic metal alloy, which may be secured by an epoxy, or a mold compound, or a ferrite loaded epoxy. While vias 208 with material 209 are shown in soft ferromagnetic layer 202, vias or holes 208 could alternatively be located in ferromagnetic layer 204 or both layers could include vias 208 and soft ferromagnetic material 209.

In some embodiments and examples, core structure 205 does not extend completely around (i.e., in an arc of $2\pi$ radians) an aperture in substrate 210. As indicated by line 250, a portion of layer 202 and a portion of layer 204, together with a portion of contact region 206 and at least one via 208 with material 209 may form sufficient core structure, 205a or 205b, for coils on opposed sides of substrate 210 (in which case, those coils would be configured appropriately as conductive paths without shorts or gaps).

Figure 3A:
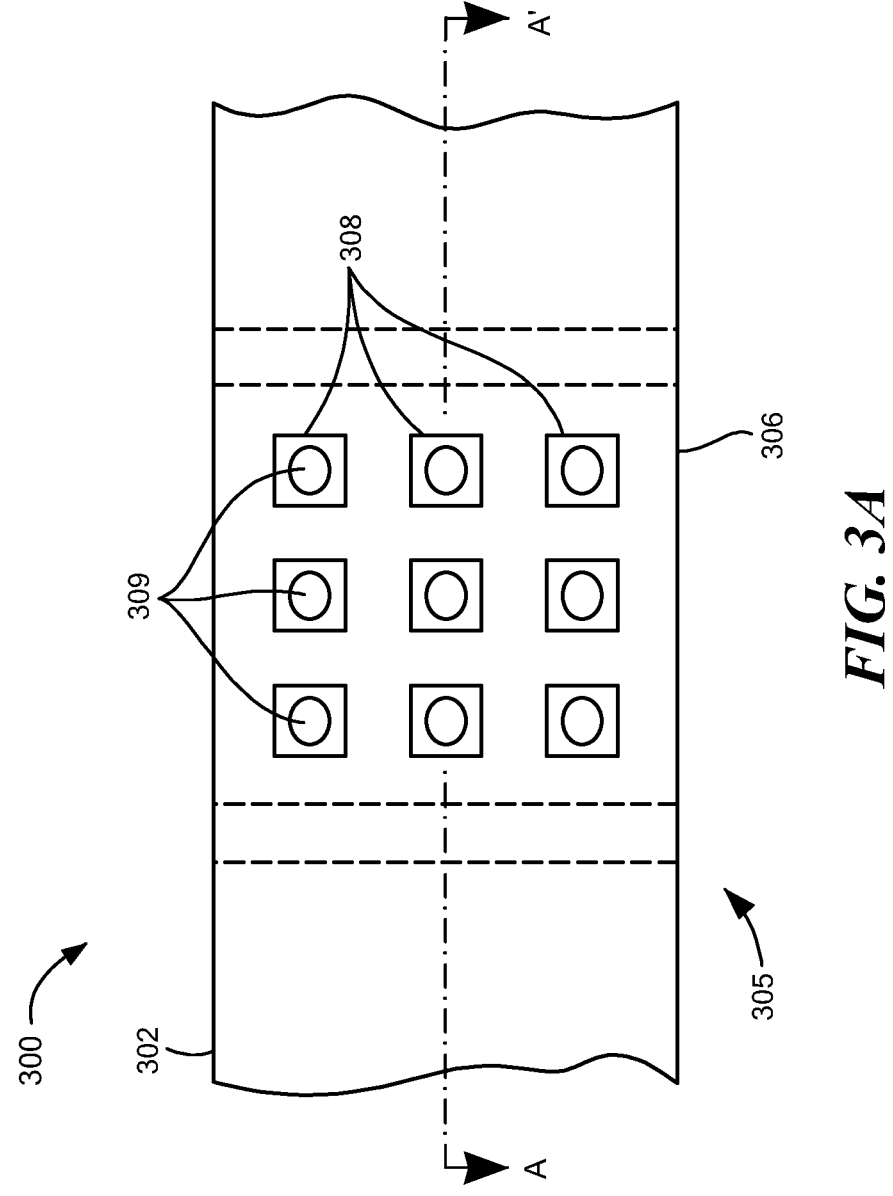
FIG. 3A is a diagram showing a top view of an alternate example of a planar transformer, in accordance with the present disclosure.
Figure 3B:
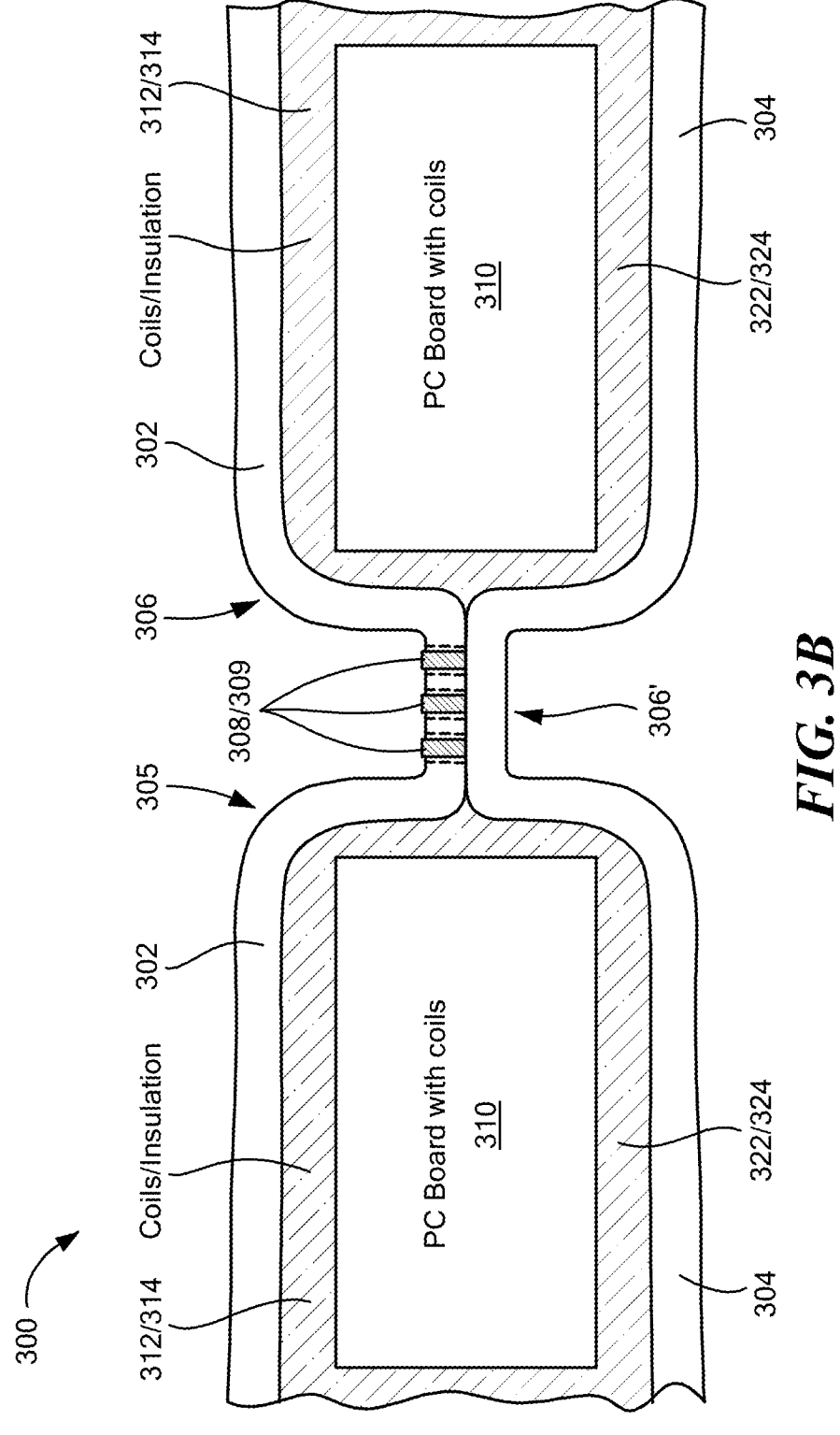
FIG. 3B is a diagram showing a side view of the transformer structure of FIG. 3A.

FIG. 3A is a diagram showing a top view of an alternate example of a planar transformer 300, in accordance with the present disclosure. FIG. 3B is a diagram showing a side view of the transformer structure 300 of FIG. 3A. Transformer structure 300 includes first and second soft ferromagnetic layers 302, 304 on opposite sides of electrical substrate 310 and in contact at a contact region 306/306,' shown as including region (first contact portion) 306 of layer 302 and region (second contact portion) 306' of layer 304. Layer 302 may include one or more holes/vias 308 at contact region 306 for holding or receiving soft ferromagnetic material 309, e.g., nickel, nickel iron alloy, or other soft ferromagnetic plating material, to reduce reluctance of core structure 305. In some embodiments (not shown), layer 304 may include one or more holes/vias 308 at contact region 306' for holding or receiving soft ferromagnetic material 309. e.g., in addition to or instead of layer 302 having such structure(s). First and second coils with insulation 312/314 and 322/324 are shown on opposed sides of substrate 310. Layer 302 is shown disposed on first coil with insulation 312/314. Layer 304 is shown disposed on second coil with insulation 322/324. As shown, transformer structure 300 is similar to structure 200 of FIG. 2 but has structure 300 has curvature in both layers 302 and 304 at contact region 306. While a single substrate 310 is shown, in some examples and embodiments, the substrate portions shown on either side of contact region 306 may be of separate substrates, e.g., separate PCBs.

FIG. 4 is a box diagram showing example method 400 of fabricating a planar transformer structure for an IC package, in accordance with the present disclosure. Method 400 can include providing first and second substrate portions (e.g., sides, surfaces), e.g., of a single substrate or multiple substrates (e.g., PCBs, or flexible substrates or flexible circuits, etc.), as described at 402. First and second coils can be provided to, e.g., disposed on, the first and second substrate portions (surfaces or sides), respectively, as described at 404. A first core layer having soft ferromagnetic material can be provided (applied) to the first substrate portion (first surface or side), covering a portion of the first coil, as described at 406. In some embodiments, the first core layer may be a conformal layer. A second core layer having soft ferromagnetic material can be provided (applied) to the second substrate portion (second surface or side), covering a portion of the second coil, as described at 408. In some embodiments, the second core layer may be a conformal layer.

A portion of the first core layer can be caused to contact (brought into contact with or joined/attached to) a portion of the second core layer, at a contact region, forming a core structure, as described at 410. The contact region may be disposed in an aperture or space formed/present in the substrate. Method 400 (e.g., at or for step 410) can include forming one or more holes (vias) in the first and/or second layer in the contract region, as described at 412. In some embodiments, the holes or vias may be formed prior to the first and second core layers being brought into contact (attachment) with one another. Soft ferromagnetic material can be introduced (put) into the one or more holes (vias) to reduce reluctance of the transformer structure, as described at 414. In some embodiments, filling the hole(s) with the soft ferromagnetic material, or depositing such material along the side of the holes, may be performed by an electroplating or electroless deposition step or process.

Figure 5:
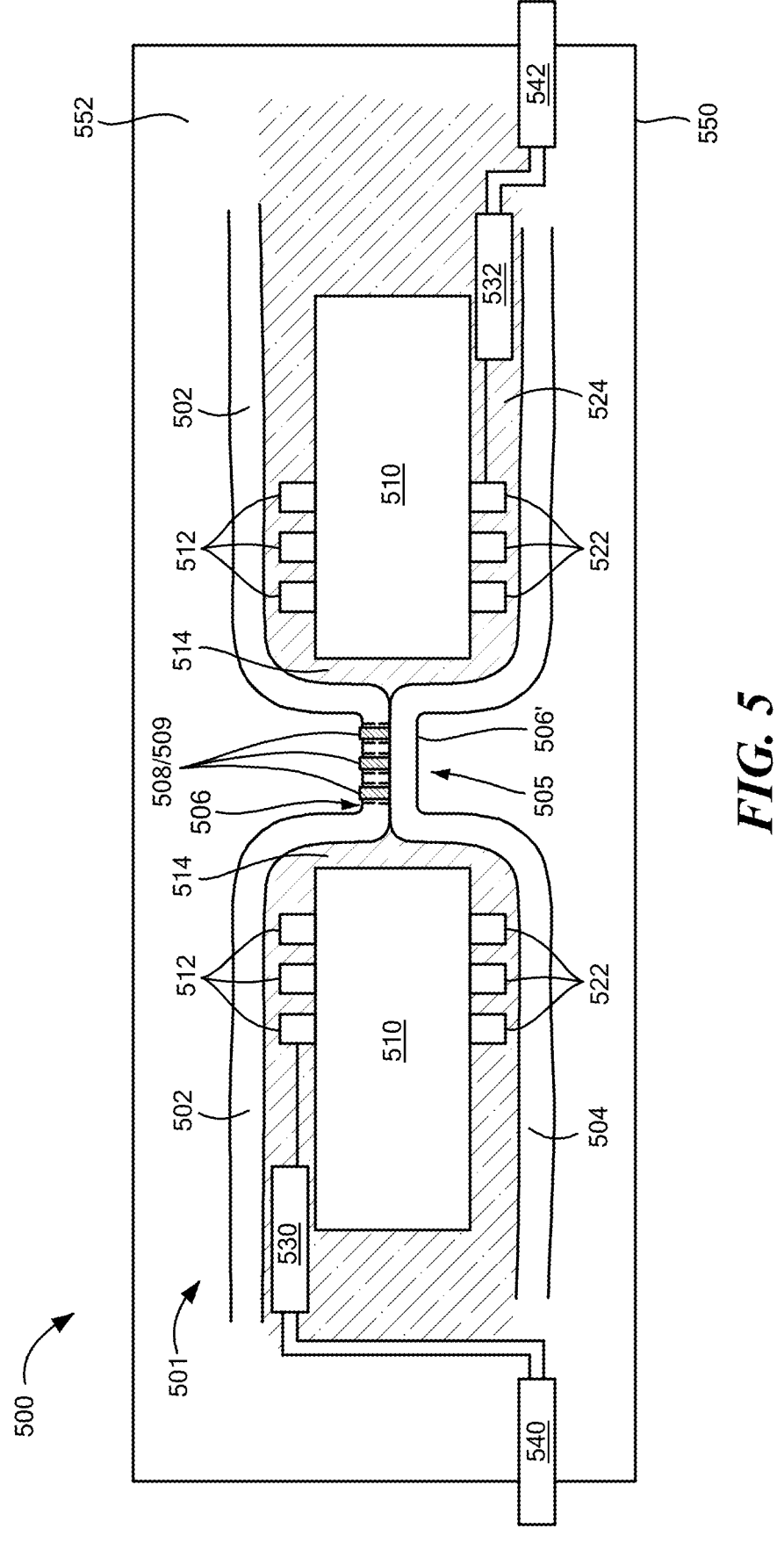
FIG. 5 is a diagram showing a side view of an example voltage-isolated integrated circuit package with planar transformer, in accordance with the present disclosure.

FIG. 5 is a diagram showing a side view of an example voltage-isolated integrated circuit package 500 with planar transformer, in accordance with the present disclosure. Package 500 can include transformer structure 501 including first and second soft ferromagnetic layers 502, 504 on opposite sides of electrical substrate 510 and in contact at a contact region 506/506,' shown as including region (first contact portion) 506 in layer 502 and region (second contact portion) 506' in layer 504. Transformer structure 501 can include first and second coils 512, 522, e.g., as shown on opposed sides of substrate 510. Insulator (dielectric) material 514 is shown adjacent coil 512 while insulator material 524 is shown adjacent coil 522. A plurality of vias (holes) 508, including soft ferromagnetic material 509, are shown disposed in layer 502 in contact region 506. Transformer structure 501 can include a magnetic core or magnetic flux concentrator 505, useful for directing flux, which can be formed by or include first and second soft ferromagnetic layers 502, 504 and soft ferromagnetic material 509. Vias 508 can be filled with or contain suitable soft ferromagnetic material 509 to reduce reluctance for transformer structure 501 including magnetic core or magnetic flux concentrator 505. While a single substrate 510 is shown, in some examples and embodiments, the substrate portions shown may be of separate substrates, e.g., separate PCBs or flexible substrates, or flexible circuits.

First and second integrated circuit (IC) die (dice) are shown disposed on substrate 510. Substrate 510, die 530, 532, and transformer structure 501 are included in package body 550. Package body can include electrical leads 540, 542 for connecting IC die to something outside of package 500, e.g., an external system, circuit, or component. Leads (or exposed conductive structure) 540, 542, can each include two or more leads (lead sets), which may be electrically isolated from each other; numbers of leads in a lead set may differ and may differ between lead sets. Package body 550 can be made of or include suitable material, e.g., molding compound, potting material, and/or insulator (dielectric) materials. As shown, first and second coils 512, 522 may be electrically connected to first and second die 530, 532, respectively, in some embodiments. Die 530, 532 can be electrically connected to leads 540, 542, respectively. The electrical connection from the coils to the leads, or die may be with wire bonds, solder or other conductive bumps, conductive pillars, or other suitable conductive structure(s)/material(s).

In some examples and embodiments, substrate portions 510, e.g., circuit board(s) and/or frame(s), may have additional polymer or insulation layers, e.g., to comply with given isolation requirements. In some examples, a printed circuit board (PCB) may be replaced with a substrate, e.g., an alumina substrate, a flexible circuit or flexible substrate, or lead frame. In some examples and embodiments, IC die 530, 532 can include one or more high-voltage circuits such as gate drivers configured to drive an external gate on a solid-state switch, e.g., a MOSFET, GaNFET, SiCFET, an IGBT, or another load, with galvanic isolation being provided by transformer structure 501.

In some examples and/or embodiments, integrated circuits (ICs) in/of die 530, 532, or other conductive features of the primary and secondary sides of transformer (structure) 505, in the main body 550 can be fabricated or configured to have a desired separation distance between certain parts or features, e.g., to meet internal creepage, voltage breakdown, or external clearance requirements for a given pollution degree rating as defined by certain safety standards bodies such as the Underwriters Laboratories (UL) and the International Electrotechnical Commission (IEC). For example, a separation distance may be between closest (voltage) points or voltage regions of the respective circuits, e.g., the low-voltage (primary) side and high-voltage (secondary) side. For further example, such a separation distance may be the distance between any two voltage points or voltage regions between the primary and secondary sides, e.g., distance between conductive lead frame portions (die pads or paddles), or circuit board areas underlying die 530,

532, or a distance between die 530 and die 532, may be or may be at least 1.2 mm, 1.4 mm, 1.5 mm, 3.0 mm, 4.0 mm, 5.5 mm, 7.2 mm, 8.0 mm, 10 mm, or 10+mm in respective examples. Such a distance between conductive portions of two or more die can include any insulation covering a conductor, e.g., such as plastic coating of a wire/lead/circuit board trace. Other distances between parts, components, and/or features of package 500, including lead (lead sets/conductive structure) 540 and 542, may also be designed and implemented, e.g., leads 540 and 542 may have a separation distance of or at least 7.2 mm, 8.0 mm, 10 mm, or 10+mm in respective examples to meet desired internal or external voltage creepage, voltage breakdown, or voltage clearance requirements; of course, other separations distances may be implemented in other embodiments.

In some examples and embodiments, dielectric material (e.g., gel) may be used for potting and/or protecting PCB system assemblies, e.g., power semiconductor packages or modules, to protect die and/or interconnects from environment conditions and/or to provide dielectric insulation. In some examples, a dielectric material may include, but is not limited to, one or more of the following materials: DOWSIL™ EG-3810 Dielectric Gel (made available by The Dow Chemical Corporation, a.k.a., "Dow", and DOWSIL™ EG-3896 Dielectric Gel (made available by Dow), which has the ability to provide isolation greater than 20 kV/mm. Other suitable gel materials may also or instead be used, e.g., to meet or facilitate meeting/achieving voltage isolation specifications required by a given package design. DOWSIL™ EG-3810 is designed for temperature ranges from −60° C. to 200° C. and DOWSIL™ EG-3896 Dielectric Gel −40° C. to +185° C.; both of which can be used to meet typical temperature ranges for automotive applications.

Accordingly, embodiments and/or examples of the inventive subject matter can afford various benefits relative to prior art techniques. For example, embodiments and examples of the present disclosure can enable or facilitate use of smaller size packages for a given power or voltage rating. Embodiments and examples of the present disclosure can enable or facilitate lower costs and higher scalability for manufacturing of IC packages/modules having voltage-isolated IC die and transformers.

Various embodiments of the concepts, systems, devices, structures, and techniques sought to be protected are described above with reference to the related drawings. Alternative embodiments can be devised without departing from the scope of the concepts, systems, devices, structures, and techniques described. For example, transformer windings (e.g., primary and secondary coils) may each have a whole number or fractional number of turns, e.g., 1.5, 2.5, 1.75, 1.8, 2.25, etc. In some embodiments, for a core, soft ferromagnetic material can be electroplated onto a ferrite or ferrite material/structure.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, which includes a list of elements is not necessarily limited to only those elements but can include other elements not expressly listed or inherent to such apparatus, method, composition, mixture, or article.

Additionally, the term "exemplary" means "serving as an example, instance, or illustration." Any embodiment or design described as "exemplary" is not necessarily to be construed as preferred or advantageous over other embodiments or designs. The terms "one or more" and "at least one" indicate any integer number greater than or equal to one, e.g., one, two, three, four, etc.; however, where context admits, such terms may indicate fractional values. The term "plurality" indicates any integer number greater than one. The term "connection" can include an indirect "connection" and a direct "connection."

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases do not necessarily refer to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal," "top," "bottom," and derivatives of those terms relate to the described structures and methods as oriented in the drawing figures. The terms "overlying," "on top," "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A planar transformer comprising:
a first substrate portion having a first plurality of conductive traces forming a first coil;
a second substrate portion having a second plurality of conductive traces forming a second coil, wherein the second substrate portion is substantially parallel with and spaced apart from the first substrate portion, wherein the transformer comprises the first and second coils;
a first core layer disposed over a first surface of the first substrate portion, wherein the first core layer comprises a soft ferromagnetic material;
a second core layer disposed over a second surface of the second substrate portion, wherein the second core layer comprises a soft ferromagnetic material;
wherein a first contact portion of the first core layer is in contact with a second contact portion of the second core layer at a contact region between the first and second substrate portions;
a first insulating layer disposed between the first surface of the first substrate portion and the first core layer;

a second insulating layer disposed between the second surface of the second substrate portion and the second core layer;

one or more through holes disposed in the first or second core layer, wherein the one or more through holes comprise a soft ferromagnetic material to connect the first core layer to the second core layer, wherein connections to the respective first and second coils are galvanically isolated from each other; and a post disposed between the first and second core layers and between the first and second substrate portions, wherein the post comprises a soft ferromagnetic material wherein the first and second coils are magnetically coupled by the first and second core layers, the post, and the soft ferromagnetic material of the holes to provide a magnetic path to channel flux created by the currents flowing in the first and second coils of the transformer.

2. The transformer of claim 1, wherein the first substrate portion or the second substrate portion comprises a printed circuit board (PCB).

3. The transformer of claim 1, wherein the first substrate portion or the second substrate portion comprises a ceramic substrate.

4. The transformer of claim 1, wherein the first substrate portion or the second substrate portion comprises a flexible substrate.

5. The transformer of claim 4, wherein the flexible substrate comprises a flexible circuit.

6. The transformer of claim 1, wherein the first or second substrate portion comprises a semiconductor die.

7. The transformer of claim 6, wherein the semiconductor die comprises an integrated circuit (IC).

8. The transformer of claim 7, wherein the integrated circuit comprises a gate driver.

9. The transformer of claim 1, further comprising a molding material configured to cover the first and/or second core layers and forming a package body.

10. The transformer of claim 1, wherein the first core layer or the second core layer comprises a conformal layer.

11. A method of making a planar transformer structure, the method comprising:

providing first and second substrate portions, wherein the second substrate portion is substantially parallel with and spaced apart from the first substrate portion;

providing first and second coils to the first and second substrate portions, respectively;

providing a first core layer, having soft ferromagnetic material, over a first surface of the first substrate portion, covering a portion of the first coil;

providing a second core layer, having soft ferromagnetic material, over a second surface of the second substrate portion, covering a portion of the second coil, wherein the transformer comprises the first and second coils;

causing the first core layer to contact the second core layer at a contact region;

forming a first insulating layer in between the first surface of the first substrate portion and the first core layer;

forming a second insulating layer disposes between the second surface of the second substrate portion and the second core layer;

forming one or more holes in the first or second core layer at the contact region;

introducing soft ferromagnetic material into the one or more holes, wherein the soft ferromagnetic material connects the first core layer to the second core layer; and providing a post disposed between the first and second core layers and between the first and second substrate portions, wherein the post comprises a soft ferromagnetic material wherein the first and second coils are magnetically coupled by the first and second core layers, the post, and the soft ferromagnetic material of the holes to provide a magnetic path to channel flux created by the currents flowing in the first and second coils of the transformer.

12. The method of claim 11, further comprising positioning a post between the first and second core layers, wherein the post comprises a soft ferromagnetic material.

13. The method of claim 11, wherein the first substrate portion or the second substrate portion comprises a printed circuit board (PCB).

14. The method of claim 11, wherein the first substrate portion or the second substrate portion comprises a ceramic substrate.

15. The method of claim 11, wherein the first substrate portion or the second substrate portion comprises a flexible substrate.

16. The method of claim 15, wherein the flexible substrate comprises a flexible circuit.

17. The method of claim 11, wherein the first or second substrate portion comprises a semiconductor die.

18. The method of claim 17, wherein the semiconductor die comprises an integrated circuit (IC).

19. The method of claim 18, wherein the integrated circuit comprises a gate driver.

20. The method of claim 11, further comprising applying a molding material to cover the first and/or second core layers and forming a package body.

21. The method of claim 11, wherein the first core layer or the second core layer comprises a conformal layer.

* * * * *